(12) United States Patent
Chen et al.

(10) Patent No.: US 10,157,943 B2
(45) Date of Patent: Dec. 18, 2018

(54) TRENCHED-BONDING-DAM DEVICE AND MANUFACTURING METHOD FOR SAME

(71) Applicant: OmniVision Technologies, Inc., Santa Clara, CA (US)

(72) Inventors: Teng-Sheng Chen, Hsinchu (TW); Chih-Hung Tu, Hsinchu (TW); Kuei-Cheng Liang, Zhubei (TW); Chia-Yang Chang, Sunnyvale, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/004,584

(22) Filed: Jan. 22, 2016

(65) Prior Publication Data

US 2017/0213864 A1    Jul. 27, 2017

(51) Int. Cl.
*H01L 27/146* (2006.01)
*H01L 23/544* (2006.01)

(52) U.S. Cl.
CPC ...... *H01L 27/14618* (2013.01); *H01L 23/544* (2013.01); *H01L 27/14625* (2013.01); *H01L 27/14632* (2013.01); *H01L 27/14685* (2013.01); *H01L 27/14687* (2013.01); *H01L 2223/5442* (2013.01); *H01L 2223/5446* (2013.01); *H01L 2223/5448* (2013.01); *H01L 2223/54426* (2013.01); *H01L 2223/54486* (2013.01); *H01L 2224/11* (2013.01)

(58) Field of Classification Search
CPC ......... H01L 27/14618; H01L 27/14685; H01L 27/14625; H01L 27/14687; H01L 27/14632; H01L 23/544; H01L 2223/5448; H01L 2223/54426
USPC ........................................................ 257/432
See application file for complete search history.

(56) References Cited

U.S. PATENT DOCUMENTS

| 8,670,055 B2 | 3/2014 | Tsujino | |
|---|---|---|---|
| 2003/0042852 A1* | 3/2003 | Chen | ............ H01L 51/5246 313/512 |

(Continued)

OTHER PUBLICATIONS

U.S. Appl. No. 14/884,390 Non-Final Rejection dated Apr. 4, 2017, 11 pages.

(Continued)

*Primary Examiner* — Marc Armand
*Assistant Examiner* — Sue Tang
(74) *Attorney, Agent, or Firm* — Lathrop Gage LLP

(57) ABSTRACT

Trenched-bonding-dam devices and corresponding methods of manufacture are provided. A trenched-bonding-dam device includes a bonding dam structure positioned upon a top surface of a substrate. The bonding dam structure has a bottom surface attached to a top surface of the substrate, an inner dam surrounded by an outer dam, and a trench between the inner and outer dams. The device may further include an optics system including a lens and an adhesive positioned within a bonding region between a bottom surface of the optics system and a top surface of at least one of the inner and outer dams. The trench may be dimensioned to receive a portion of the excess adhesive flowing laterally out of the bonding region during bonding of the substrate to the optics system, laterally confining the excess adhesive and reducing lateral bleeding of the adhesive.

11 Claims, 10 Drawing Sheets

(56) References Cited

U.S. PATENT DOCUMENTS

| | | | |
|---|---|---|---|
| 2005/0247976 A1 | 11/2005 | Ting et al. | |
| 2006/0255441 A1 | 11/2006 | Ohta | |
| 2007/0041106 A1 | 2/2007 | Chiang | |
| 2008/0247064 A1 | 10/2008 | Chiang | |
| 2009/0225431 A1* | 9/2009 | Lee | G02B 7/02 359/621 |
| 2010/0284077 A1 | 11/2010 | Shyu et al. | |
| 2013/0258504 A1 | 10/2013 | Wang | |
| 2013/0258508 A1 | 10/2013 | Wang | |
| 2014/0064662 A1 | 3/2014 | Ootorii | |
| 2014/0191350 A1 | 7/2014 | Chen et al. | |
| 2014/0355870 A1* | 12/2014 | Venkataraman | H04N 5/2253 382/154 |
| 2016/0306265 A1* | 10/2016 | Riel | G02B 7/02 |
| 2017/0012069 A1* | 1/2017 | Rudmann | H01L 27/14618 |

OTHER PUBLICATIONS

Non-Final Office Action in U.S. Appl. No. 14/884,390 dated Jan. 24, 2018, 11 pp.
Final Rejection corresponding to U.S. Appl. No. 14/884,390, dated Sep. 28, 2017, 11 pages.
Taiwanese Patent Application No. 105140613, English translation of Office Action dated Feb. 26, 2018, 4 pages.
Taiwanese Patent Application No. 105140613, Office Action dated Feb. 26, 2018, 6 pages.
Taiwanese Patent Application No. 105140613, English translation of Office Action dated Jun. 27, 2018, 5 pages.
Taiwanese Patent Application No. 105140613, Office Action dated Jun. 27, 2018, 6 pages.

* cited by examiner

TRENCHED-BONDING-DAM DEVICE AND MANUFACTURING METHOD FOR SAME

BACKGROUND

Cameras are incorporated into a wide range of devices, such as phones, tablets, laptop computers, and video displays. To meet targeted costs for such devices, it is beneficial to manufacture the camera at a very low cost. The manufacturing cost of a typical camera module includes the cost of the materials/components from which the camera is fabricated (e.g., image sensor, lens material, packaging material) and the cost of assembling the camera into a package suitable for integration within its intended device.

In many cases, the cost of assembly is significant and may exceed the cost of materials. For example, image sensors and lenses may be inexpensively produced, while the cost to perform assembly operations such as alignment of the lens and imaging sensor and bonding the lens and sensor together are significantly greater.

Accordingly, there exists an ongoing need for improved systems and methods that reduce the cost of assembling electronic devices.

SUMMARY

In an embodiment of the disclosure, a method for assembling a trenched-bonding-dam device is provided. The method includes attaching a bonding dam structure upon a top surface of a substrate. The bonding dam structure has a bottom surface attached to the top surface of the substrate, an inner dam surrounded by an outer dam, and a trench between the inner and outer dams. The method further includes aligning an optics system with respect to a substrate element on the substrate, the optics system having a lens. The method additionally includes bonding the aligned substrate and optics system to one another, a bottom surface of the optics system being coupled to a top surface of at least one of the inner and outer dams.

In another embodiment of the disclosure, a trenched-bonding-dam device is provided. The device includes at least one bonding dam structure positioned upon a top surface of a substrate. The bonding dam structure has a bottom surface attached to a top surface of the substrate, an inner dam region surrounded by an outer dam region, and a trench between the inner and outer dams.

In a further embodiment, a trenched-bonding-dam device is provided. The device includes a first substrate coupled to a first lens, a second substrate including a spacer and overlying the first substrate, a third substrate coupled to a second lens and overlying the second substrate, and a cover overlying the third substrate. The device also includes a first bonding dam having (i) a bottom surface attached to a top surface of the first substrate, (i) a top surface attached to a bottom surface of the second substrate; (iii) a first inner dam surrounded by a first outer dam, and (iii) a first trench between the first inner dam and the first outer dam. The device additionally includes a second bonding dam having (i) a bottom surface attached to a top surface of the second substrate, (i) a top surface attached to a bottom surface of the third substrate; (iii) a second inner dam surrounded by a second outer dam, and (iii) a second trench between the second inner dam and the second outer dam. The device further includes a third bonding dam having (i) a bottom surface attached to a top surface of the third substrate, (i) a top surface attached to a bottom surface of the cover; (iii) a third inner dam surrounded by a third outer dam, and (iii) a third trench between the third inner dam and the third outer dam.

DETAILED DESCRIPTION

In general, 3-D assembly of electronic devices includes alignment and bonding of at least two different components to create a vertically integrated structure. Alignment ensures that each of the components is arranged in a desired position with respect to one another, while bonding provides a mechanical bond between the components.

Adhesive bonding is one technique for bonding components during 3-D assembly. An adhesive is applied to one or both of the surfaces of the components (e.g., a top surface of one component and/or a bottom surface of the other component). The opposing surfaces of the components are aligned with respect to one another and brought into contact. Once in contact, the components are maintained in place while the adhesive sets, transitioning from an initial, flowable state to a final, relatively rigid state. Once in the rigid state, the adhesive secures the two components together.

A problem arising with adhesive bonding is that the adhesive may bleed, where it flows outside the region intended for bonding. Such adhesive bleeding may result in unintended bonding, physical blockage of regions intended to remain open, and other undesirable effects. In one aspect, if bleeding is severe enough, it can impair or even curtail proper operation of the components. In another aspect, the in-plane size of the components may need to be increased to provide a tolerance for such bleeding and avoid its undesirable effects.

Figure 1:
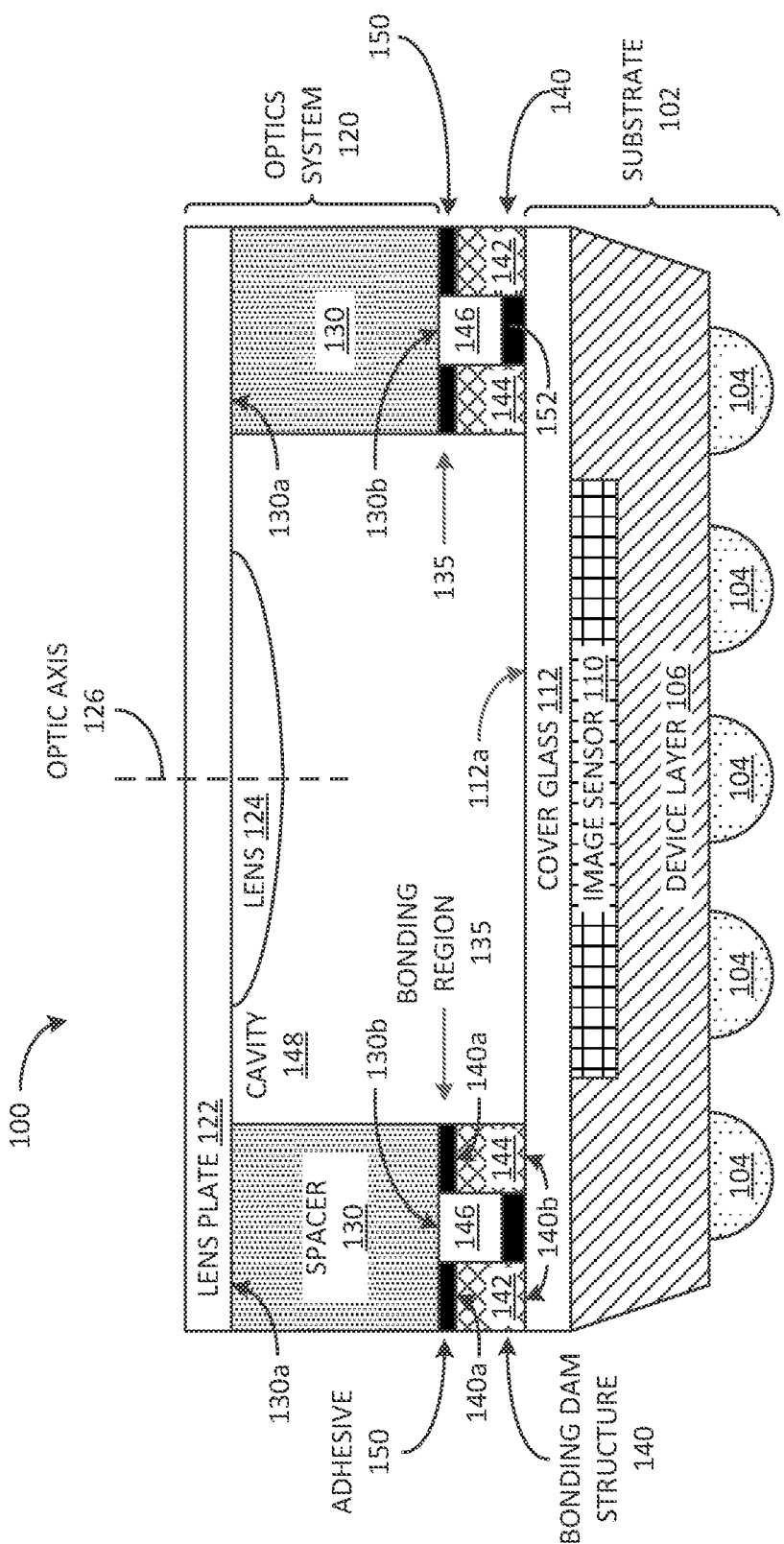
FIG. 1 is a cross-sectional view of an embodiment of a die-level trenched-bonding-dam device.

Embodiments of the present disclosure are directed to improved methods for assembly of trenched-bonding-dam devices and the resultant trenched-bonding-dam devices. FIG. 1 is a cross-sectional view showing an embodiment of a trenched-bonding-dam device 100 that is a camera module. The trenched-bonding-dam device 100 includes a substrate 102, an optics system 120, and a bonding dam structure 140. It may be understood that, while embodiments of the disclosure are discussed herein with reference to camera modules, the disclosed embodiments may be employed for assembly of any trenched-bonding-dam device, without limit.

With continued reference to FIG. 1, embodiments of the substrate 102 and optics system 120 will now be discussed in detail. The substrate 102 is a chip-scale package (CSP) including solder balls 104, a device layer 106, image sensor 110, and cover glass 112. The solder balls 104 are in electrical communication with the image sensor 110.

The optics system 120 includes a lens plate 122 having a lens 124 and a spacer 130 separating the lens 124 and image sensor 110. As discussed in greater detail below, the lens 124 has an optic axis 126 aligned with the image sensor 110. Each of the lens plate 122, the lens 124, and the spacer 130 may be independently formed from any transparent material suitable for transmission of light of desired wavelengths (e.g., glasses). It may be understood that the optics system 120 may further include other packaging components, spacers, and/or optically active or passive components, as necessary. Examples of optically passive components may include, but are not limited to, layers to block selected wavelengths of light from reaching the substrate 102 (e.g., infrared (IR) filters, ultraviolet (UV) filters, etc.). Examples of optically active components may include, but are not limited to, electro-optic modulators.

As further illustrated in FIG. 1, the bonding dam structure 140 is positioned on a top surface 112a of the substrate 102. The bonding dam structure 140 includes an inner dam 144 surrounded by an outer dam 142 and a trench 146 positioned between the outer dam 142 and the inner dam 144. The bonding dam structure 140 further includes a top surface 140a and a bottom surface 140b common to each of the outer dam 142 and inner dam 144.

The dimensions of the bonding dam structure 140 may be selected so as to ensure that the trench 146 is of sufficient volume to contain a desired amount of excess adhesive 152. In an embodiment, the length of each side of the inner and outer dams 142, 144 may be independently selected between about 100 µm to about 200 µm, while the height of each of the inner and outer dams 142, 144 may be independently selected between about 40 µm to about 80 µm. For example, the outer dam 142 may possess a side length selected within the range between about 160 µm to about 200 µm and the inner dam 144 may possess a length selected within the range between about 100 µm to about 140 µm. In further embodiments, the aspect ratio (width:height) of the dams 142, 144 may be independently selected between about 2.5 to about 5.

It may be understood, however, that alternative embodiments of the bonding dam structure may adopt configurations, without limit. In one example, each of the outer and inner dams may be independently selected from other closed sided shapes (e.g., possessing greater or fewer sides, straight sides, curved sides, ovals, circles, etc. and combinations thereof). In a further example, the distance between the outer and inner dams 142, 144 may be varied. In another example, the bonding dam structure may include greater than two dams and form more than one trench. In an additional example, the bonding dam structure may possess a single dam having a U-shaped cross-section or a W-shaped cross-section, where the space between the vertical legs of the bonding dam structure defines one or more trenches.

The substrate 102 and optics system 120 are bonded together by an adhesive 150. The adhesive 150 may be any adhesive with suitable properties for securing the substrate 102 to the optics system 120 via the bonding dam structure 140. Examples of such properties may include, but are not limited to, physical properties (e.g., rheology, strength, etc.), chemical properties (e.g., chemical compatibility, etc.), and the like. In certain embodiments, the adhesive 150 may be a curable adhesive, for example one cured by exposure to ultraviolet light. Examples of the adhesive may include, but are not limited to, JC514-TDS-C-10042201 (UV adhesive), STYCAST® 1269AB (thermal adhesive; Trelleborg Emerson & Cuming, Inc.).

The adhesive 150 is positioned within a bonding region 135 between a lower surface of the optics system 120 (e.g., a lower surface 130b of spacer 130) and the top surface 140a of at least one of the outer dam 142 and inner dam 144. As discussed in greater detail below, the trench 146 may receive a portion of the adhesive 150 (e.g., excess adhesive 152) flowing laterally out of the bonding region 135 during bonding of the substrate 102 to the optics system 120, thereby laterally confining the excess adhesive 152.

Beneficially, the trenched-bonding-dam device 100 substantially inhibits lateral bleeding of the excess adhesive 152 outside of the bonding region 135, reducing the lateral tolerance required to account for adhesive bleeding. For example, it has been observed that the bleeding tolerance of camera modules of embodiments of the disclosure may be reduced to less than 100 µm. Beneficially, the reduced bleeding tolerance allows the lateral extent of electronically active areas of the trenched-bonding-dam device 100 (e.g., image sensor 110) to be increased or the lateral dimensions of the trenched-bonding-dam device 100 to be decreased.

In further benefit, the presence of the bonding dam structure 140 and adhesive 150 also allows the focal length between the lens 124 and image sensor 110 to be adjusted during assembly, improving manufacturing yields. For example, without the bonding dam structure, only the minimum amount of adhesive needed to cover the bonding region 135 would be used in order to reduce the extent of bleeding. However, with the bonding dam structure 140 present, an amount of adhesive 150 greater than that needed to cover the desired bonding region 135 can be employed. At least a portion of excess adhesive 152 flowing from the bonding region 135 is captured within the trench 146 by the bonding dam structure 140, inhibiting the lateral extent of bleeding. Concurrently, the adhesive 150 remaining within the bonding region 135 may be of greater thickness than that achieved without the bonding dam structure, allowing the distance between the optics system 120 and the top surface 112a of the substrate 102 to be increased or decreased, as desired, during assembly.

Figure 2:
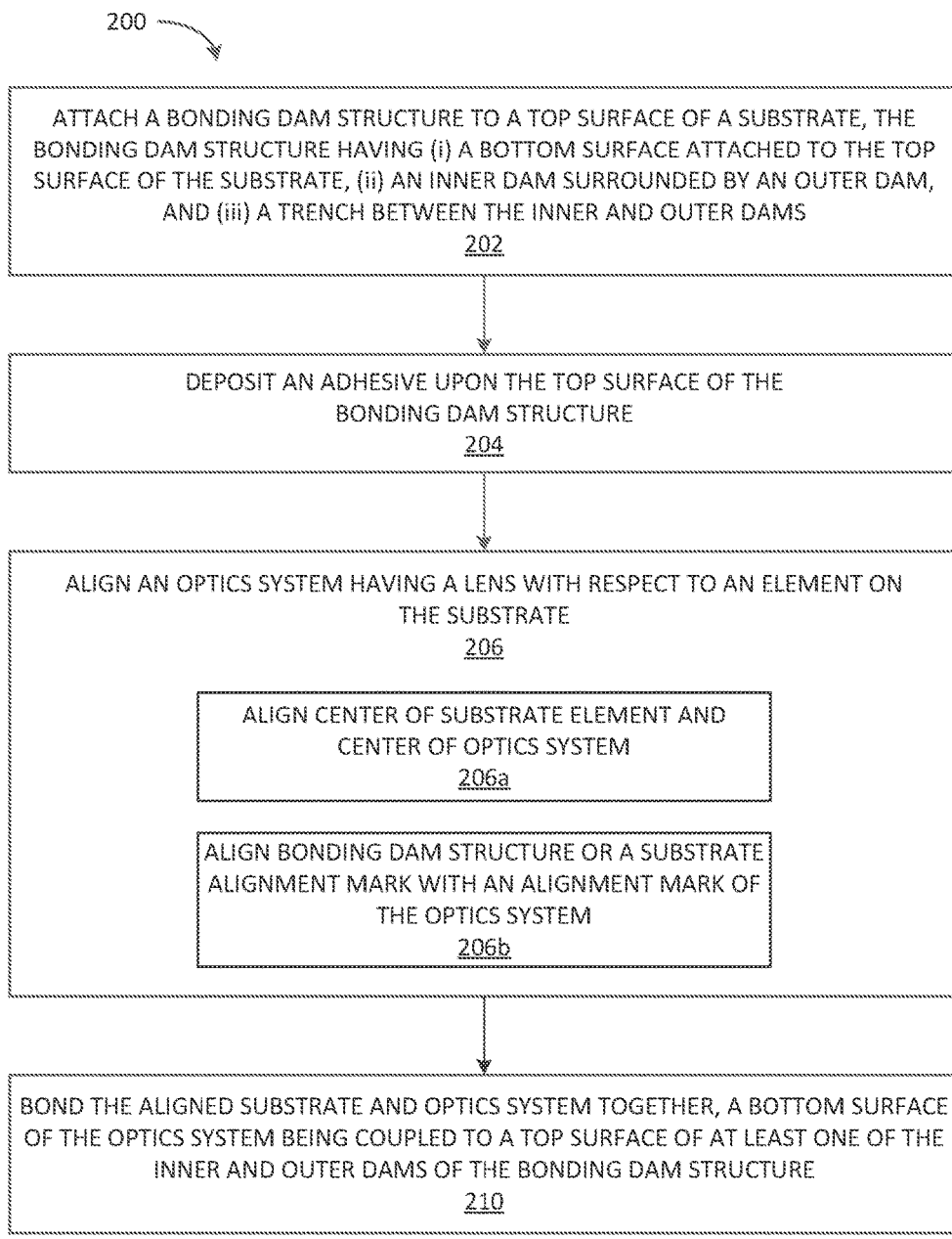
FIG. 2 is a flowchart illustrating an embodiment of a method for fabricating the trenched-bonding-dam device of FIG. 1.

The discussion will now turn FIG. 2, which is a flowchart illustrating an embodiment of a method 200 for assembling the trenched-bonding-dam device 100. The method 200 includes operations 202-210, discussed in detail below with further reference to FIGS. 3A-3B, 4A-4B, and 5. It may be understood that, in certain embodiments, one or more of the operations 202-210 may be performed in an order differing from that illustrated in FIG. 2 or optionally omitted, as necessary.

Figure 3A:
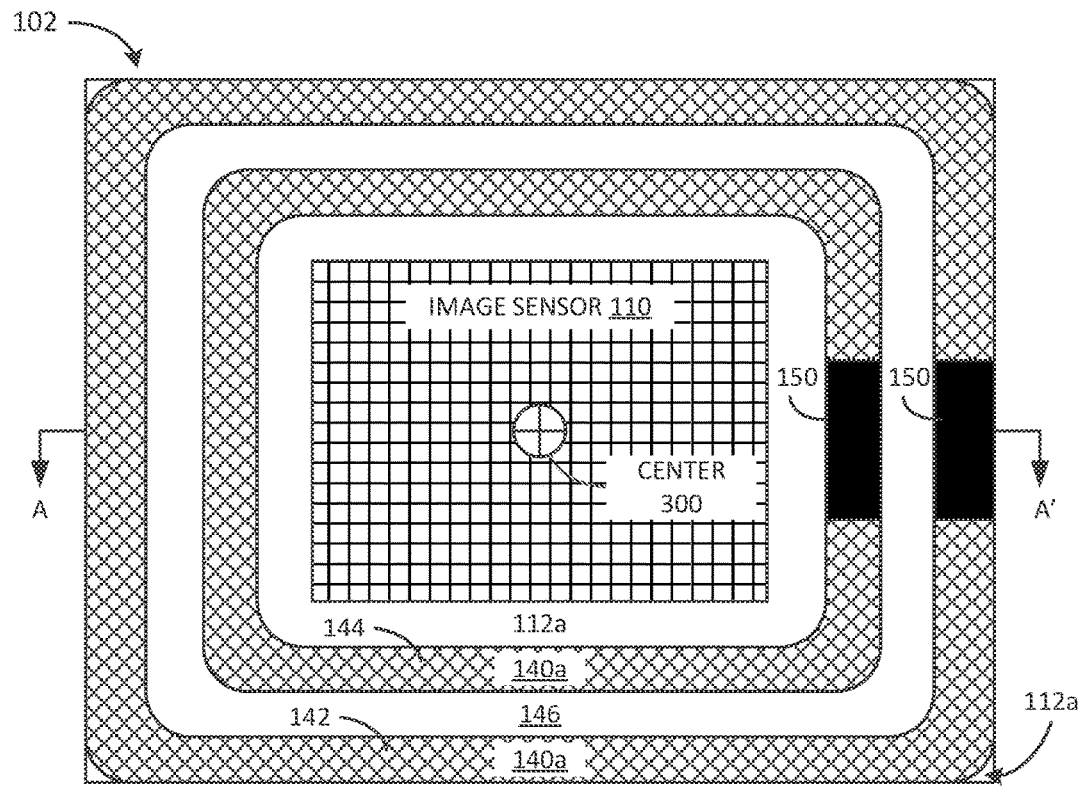
FIGS. 3A-3B show a plan view and a cross-sectional view, respectively, of a bonding dam structure on a top surface of an image sensor chip-scale package, in an embodiment.
Figure 3B:
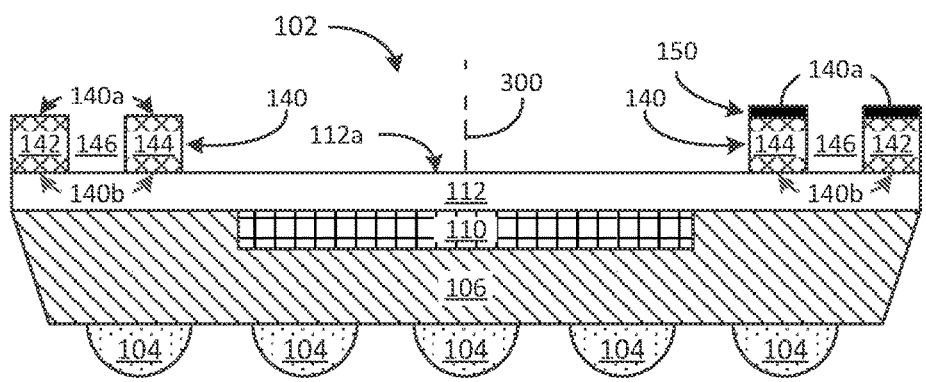

In operation 202, method 200 attaches a bonding dam structure to a top surface of a substrate, the bonding dam structure having an inner dam surrounded by an outer dam, and a trench between the inner and outer dams. In an example of operation 202, a bonding dam structure 140 is applied to top surface 112a of substrate 102, shown in FIGS. 3A-3B. FIG. 3A shows a plan view of the trenched-bonding-dam device 100, while FIG. 3B is a corresponding cross-sectional view. Bonding dam structure 140 has inner dam 144 surrounded by outer dam 142 and trench 146 between outer and inner dams 142, 144. Outer dam 142 and inner dam 144 may be rectilinear in shape and nested, with the outer dam 142 positioned closer to a lateral edge of the substrate 102 than the inner dam 144. Opposing lateral faces of the outer dam 142 and inner dam 144, along with the top surface 112a of the substrate 102 may bound the trench 146.

In certain embodiments, the bonding dam structure 140 may be pre-formed and attached to the substrate 102. In alternative embodiments, the bonding dam structure 140 may be formed on the substrate 102 from at least one of photoresist, epoxies, silicon, or metals. Forming techniques may include, but are not limited to, lithography, glue replication, etching, and plating, alone or in any combination.

In operation 204, the method 200 deposits an adhesive upon the top surface of the bonding dam structure in preparation for bonding. In an example of operation 204, the adhesive 150 is deposited upon the top surface 140a of the bonding dam structure 140 in preparation for bonding, further shown in FIGS. 3A-3B. Deposition of the adhesive 150 may be accomplished by one or more of a roller print, a stencil print, a line pattern, and the like. In one embodiment, the adhesive 150 is deposited upon respective top surfaces 140a of each of the inner and outer dams 142, 144. However, in alternative embodiments (not shown), the adhesive may be deposited on a single one of the dams. In a further embodiment (not shown), the adhesive may be deposited on a lower surface of the optics system (e.g., 130b). In further embodiments (not shown), the adhesive may be deposited on both the top surface of at least one of the bonding dams and the bottom surface of the optics system (e.g., 130b).

In operation 206, the method 200 aligns the optics system with respect to a substrate element on the substrate. In an example of operation 206, the optics system 120 includes lens 124 with optic axis 126 that is aligned with respect to an element on the substrate 102 (e.g., image sensor 110). Improved bonding accuracy allows the size of the trenched-bonding-dam device 100 (e.g., die size) to be decreased, as well as improving device yields, reducing the cost to manufacture the trenched-bonding-dam device 100.

To facilitate the alignment operation 206, the optics system 120 and at least one of the substrate 102 and bonding dam structure 140 further include respective alignment markers. For example, in one embodiment, the alignment markers of the bonding dam structure 140 may include the top surface 140a of either or both of the outer and inner bonding dams 142, 144. In another embodiment (not shown), the alignment markers of the substrate 102 may include one or more patterns formed on or within the substrate (e.g., on top surface 112a of the cover glass 112 or within the cover glass 112).

Figure 4A:
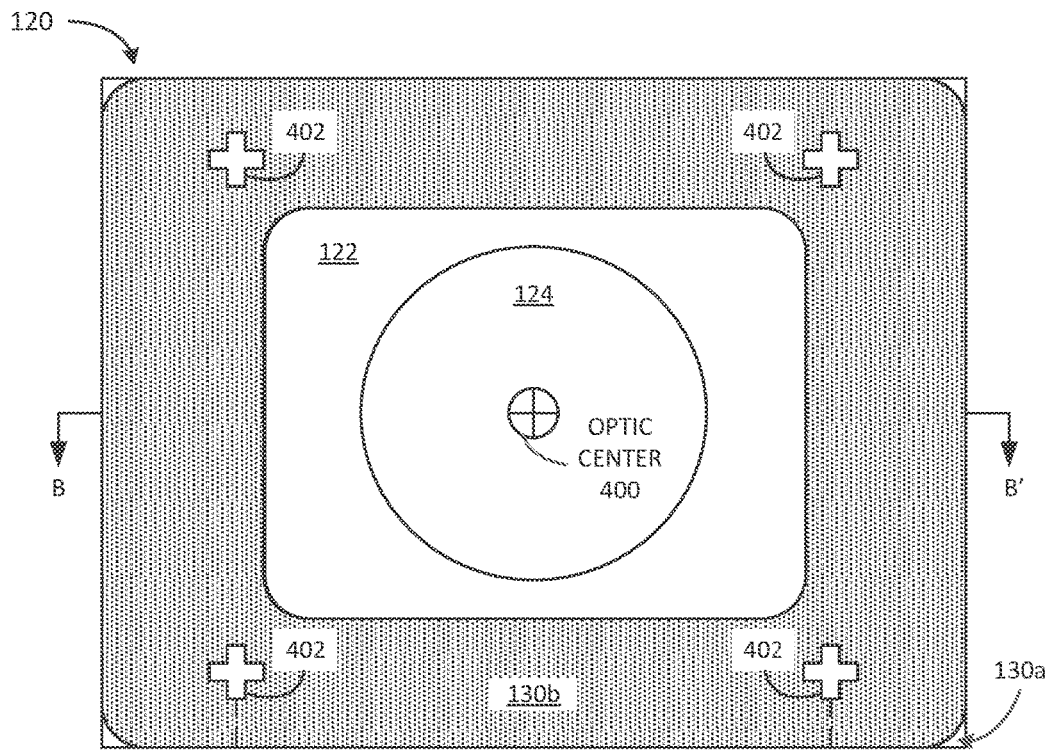
FIGS. 4A-4B show a bottom plan view and a corresponding cross-sectional view, respectively, of an optics system aligned above the chip-scale package of FIG. 3, in an embodiment.
Figure 4B:
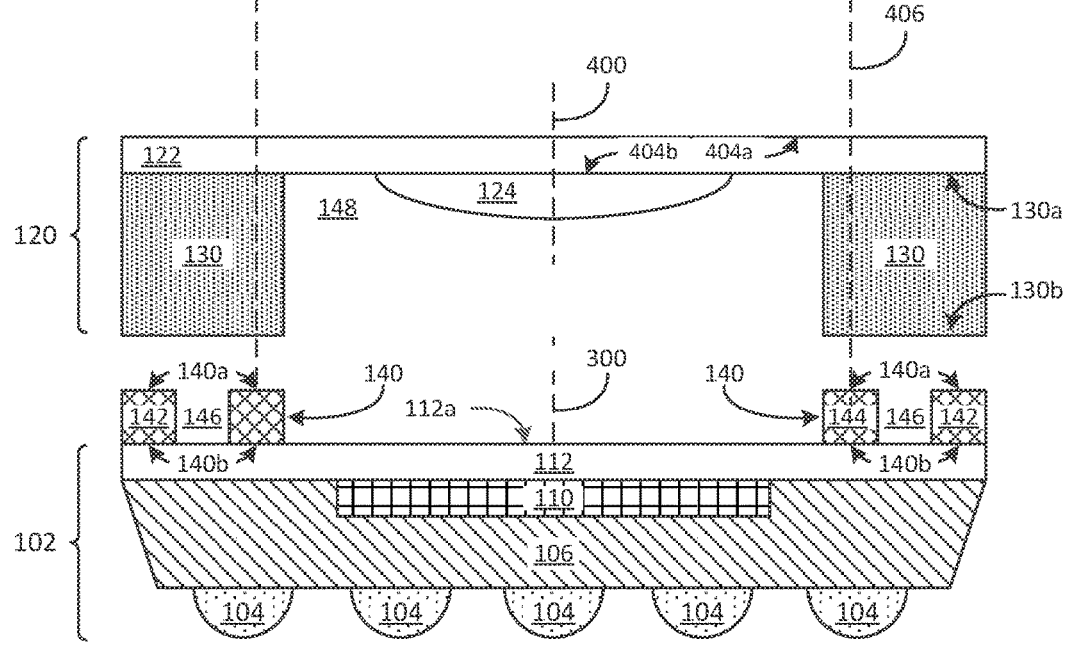

As further illustrated in the embodiment of FIGS. 4A-4B, a bottom plan view and corresponding cross-sectional view, respectively, of the optics system 120 aligned above the substrate of FIG. 3. Alignment markers 402 of the optics system 120 may be one or more patterns formed on a top surface or bottom surface of the optics system 120. Such patterns may be formed by deposition of metal, photoresist, and combinations thereof. An example of the position of the top surface of the optics system 120 is the top surface 404a of the lens plate 122. An example of the position of the bottom surface of the optics system 120 is the bottom surface 404b of the lens plate 122 or the bottom surface 130b of the spacer 130. It may be understood, in further embodiments, the alignment markers may be positioned in alternative positions that are suitable for alignment.

The alignment markers 404 formed on the optics system 120 may be any geometric design (e.g., lines, patterns, shapes, etc.) clearly distinguishable from their surroundings (e.g., by automated pattern recognition software). Furthermore, any desired feature of the alignment markers 404 (e.g., edge features, overall shape, center of mass, etc.) may be employed for alignment.

In operation 206a, method 200 aligns a center of the substrate element and a center of the optics system. In an example of operation 206a, a center 300 of the substrate 102 and a center 400 of the optics system 120 are axially aligned using the alignment markers 140a, 402. The centers 300 and 400 may be identified by automated pattern recognition software. The relative positions of respective alignment markers of the substrate 102 (e.g., 140a) and optics system 120 (e.g. 404) with respect to the centers 300, 400 may be further identified in operation 206a. Subsequently, the substrate 102 and optics system 120 are positioned in-plane with respect to one another to align the centers 300, 400 (FIG. 4B).

In operation 206b, the method 200 aligns the bonding dam structure or a substrate alignment mark with an alignment mark of the optics system. In an example of operation 206b, once the centers 300, 400 are axially aligned the substrate 102 and optics system 120 are rotated for in-plane alignment of the substrate 102 and optics system 120 (FIGS. 4A-4B). For example, assume that the alignment marker of the bonding dam structure 140 is the top surface 140a of the inner bonding dam 144. Further assume that the alignment marker 402 of the optics system 120 is a pattern deposited on the bottom surface 130b of the spacer 130. By rotating either or both of the substrate 102 and optics system 120 about their respective centers 300, 400, the alignment markers 404 are overlaid upon the top surfaces 140a of the inner bonding dam 144.

Figure 5:
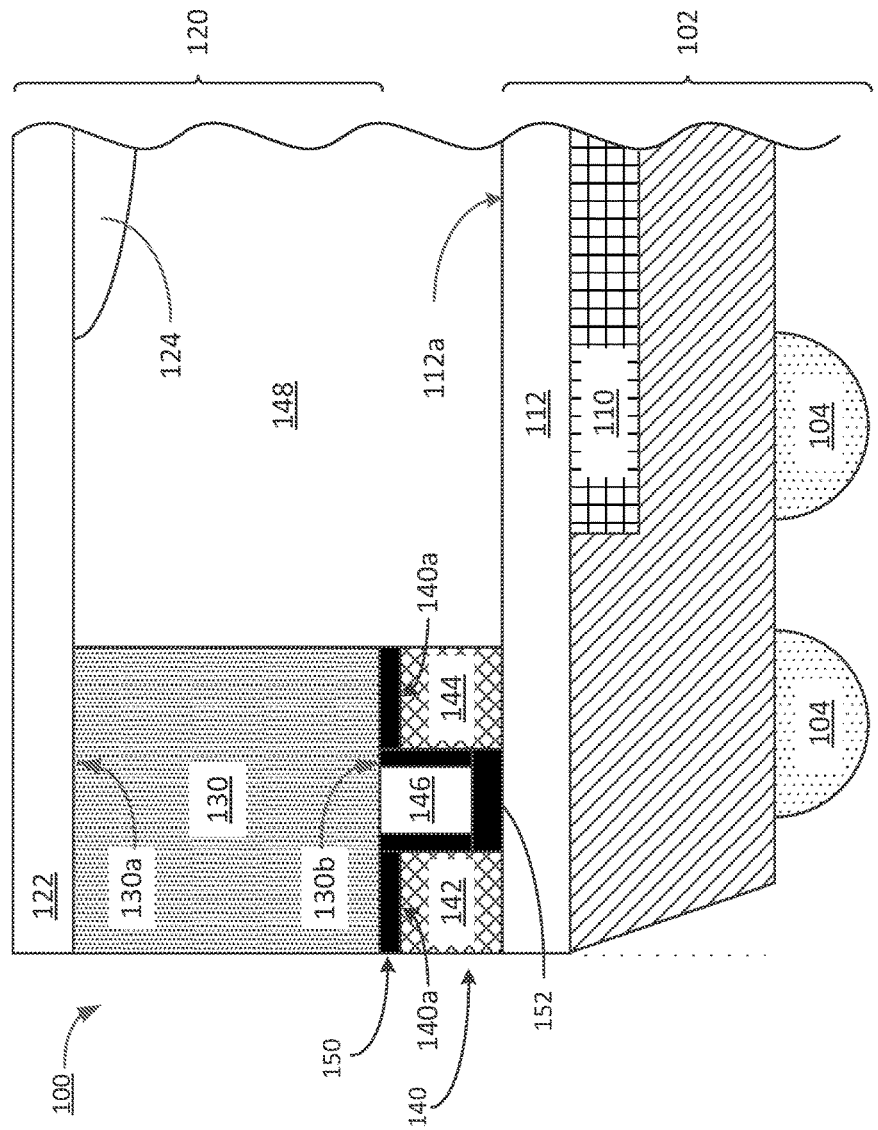
FIG. 5 is a cross-sectional view of an embodiment of the trenched-bonding-dam device during bonding of the optics system of FIG. 4 to the chip-scale package of FIG. 3.

In operation 210, the method 200 bonds the aligned substrate and optics system together, where at bottom surface of the optics system is coupled to a top surface of at least one of the inner and outer dams of the bonding dam structure. In an example of operation 210, the substrate 102 and optics system 120 are bonded together by the adhesive 150 while maintained in their aligned position to provide the trenched-bonding-dam device 100 shown in FIG. 1. As illustrated in FIG. 5, bottom surface 130b of the optics system 120 is urged towards the top surface 140a of the bonding dam structure 140. Assuming, for the sake of example, that the adhesive 150 is deposited upon the top surface 140a of each of the inner and outer dams 142, 144. In this circumstance, as the bottom surface 130b of the optics system 120 contacts the adhesive 150, the adhesive 150 spreads laterally across the top surface 140a of each the dams 142, 144 (i.e., the bonding region 135). The excess adhesive 152 further flows beyond the area of the bonding region 135 where it is confined within the trench 146 and inhibited from further lateral spreading. After alignment, the substrate 102 and optics system 120 are maintained in their aligned position until the adhesive 150 is set. After the adhesive 150 has set, the assembled trenched-bonding-dam device (e.g., a camera module) may be integrated into other devices.

Figure 6A:
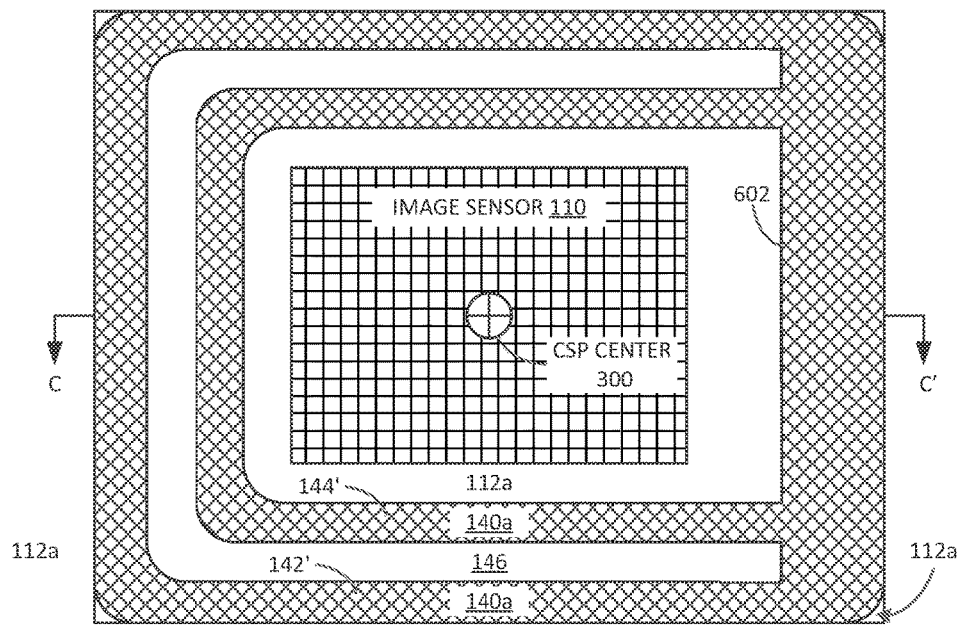
FIGS. 6A-6B show a plan view and a cross-sectional view, respectively, of an alternative embodiment of a bonding dam structure on a top surface of an image sensor chip-scale package, where one side of the bonding dam structure omits an inner dam.
Figure 6B:
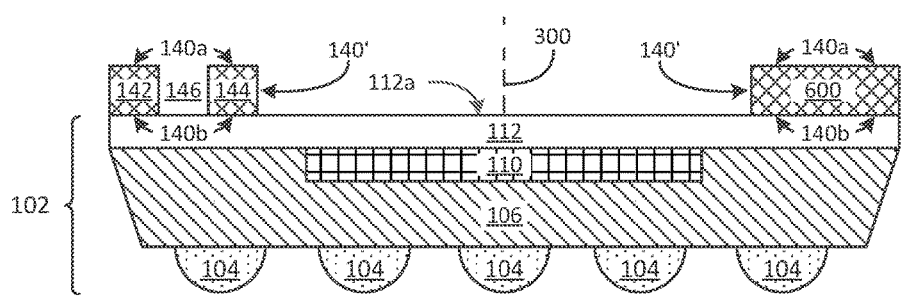

The discussion will now turn to alternative embodiments of the trenched-bonding-dam device with reference to FIGS. 6A-6B and 7A-7B. FIGS. 6A-6B show plan and cross-sectional views, respectively, of a bonding dam structure 600 attached to substrate 102. The bonding dam structure 600 differs from the bonding dam structure 140 by omission of the inner dam 144 on one side 602. The device bonding dam structure 600 is otherwise unchanged from bonding dam structure 140 and may be provided according to the above-discussed embodiments of method 200.

Figure 7A:
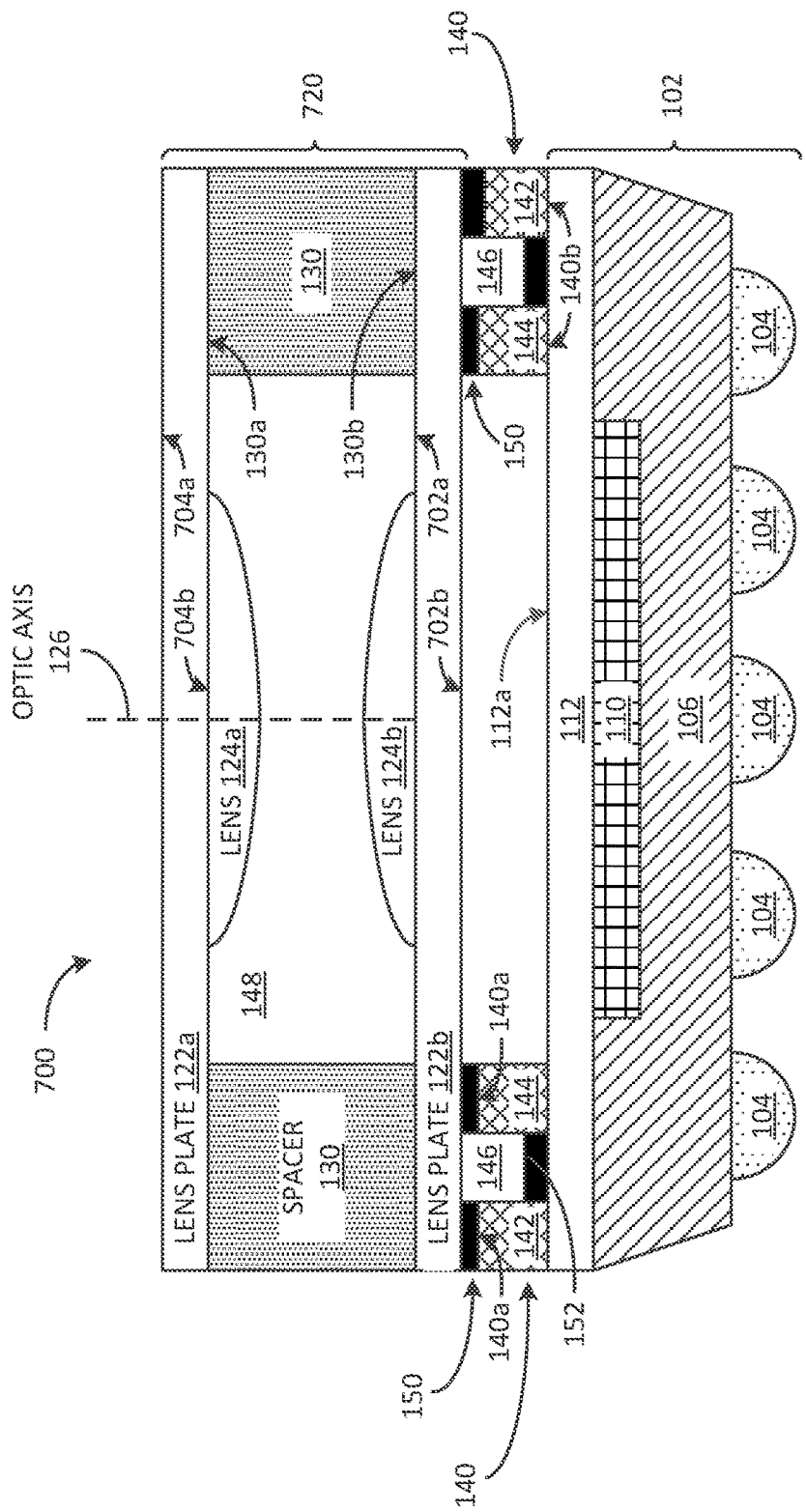
FIG. 7A is a cross-sectional view of an alternative embodiment of a trenched-bonding-dam device including an image sensor chip-scale package and an optics system including two lenses.
Figure 7B:
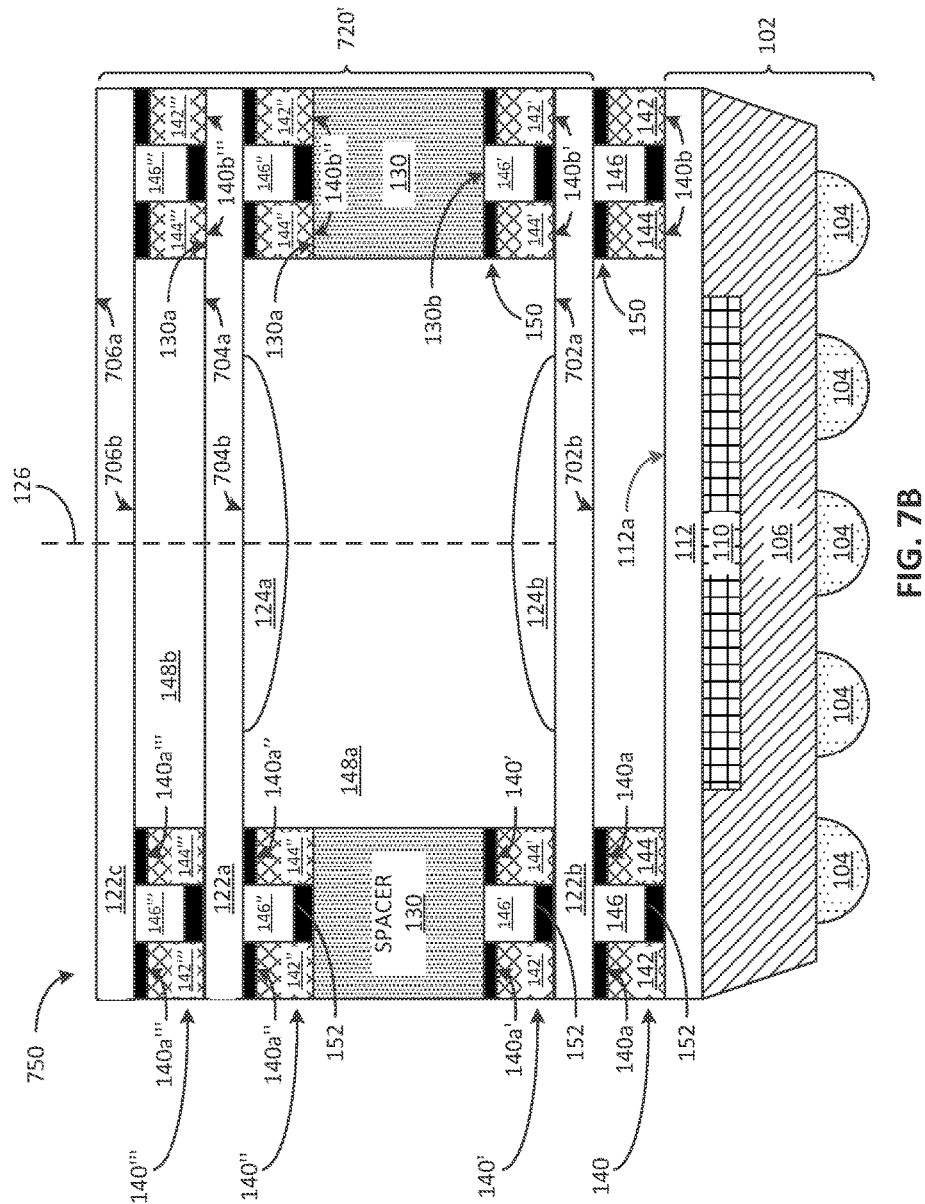
FIG. 7B is a cross-sectional view of an alternative embodiment of the trenched-bonding-dam device of FIG. 7A.

FIGS. 7A-7B are cross-sectional views of alternative embodiments of a trenched-bonding-dam devices 700 and 750 having optics system 720 and 720' that differ from optics system 120. In the embodiment of FIG. 7A, the optics system 720 includes two lenses, 124a and 124b, coupled to respective lens plates 122a, 122b. The device 700 is otherwise unchanged from the trenched-bonding-dam device 100 and may be formed according to the above-discussed embodiments of method 200.

In the embodiment of FIG. 7B, a trenched-bonding dam device 750 is illustrated having optics system 720' coupled to substrate 102 via bonding dam structure 140. The bonding dam structure 140 may be formed and attached to the optics system 720' as discussed above with respect to method 200. It may be understood that, in further embodiments, however, the optics system 720' may be combined with any substrate without limit.

The optics system 720' includes the two lenses 124a and 124b coupled to their respective lens plates 122a, 122b, the spacer 130, and a cover plate 122c. The lens plates 122a, 122b, spacer 130, and cover plate 122c are coupled together by respective first, second and third bonding dam structures 140', 140", and 140"'. The configuration of each of the bonding dam structures 140', 140", and 140"' (e.g., geometry, dimensions, materials, etc.) may be independently selected from those discussed above with respect to bonding dam structure 140. For example, the first bonding dam structure 140' has a first outer dam 142', a first inner dam 144', and a first trench 146' between the first dams 142', 144'. A bottom surface 140b' of the first bonding dam structure 140' is attached to a top surface 702a of the lens plate 122b. A top surface 140a' of the first bonding dam structure 140' is attached to the bottom surface 130b of the spacer 130. The second bonding dam structure 140" has a second outer dam 142", a second inner dam 144", and a second trench 146" between the second dams 142", 144". A bottom surface 140b" of the second bonding dam structure 140" is attached to the top surface 130a of the spacer 130. A top surface 140a" of the second bonding dam structure 140" is attached to the bottom surface 704b of the second lens plate 122a. The third bonding dam structure 140"' has a third outer dam 142"', a third inner dam 144"', and a third trench 146"' between the third dams 142"', 144"'. A bottom surface 140b"' of the third bonding dam structure 140"' is attached to the top surface 704a of the lens plate 122a. A top surface 140a"' of the third bonding dam structure 140"' is attached to the bottom surface 706b of the cover plate 122c. The top surface 706a of the cover plate 122c serves as the top surface of the optics system 720'. The bonding dam structures 140', 140", and 140"' may be formed and attached to the lens plates 122a, 122b, the spacer 130, and cover plate 122c as discussed above with respect to the method 200.

Figure 8A:
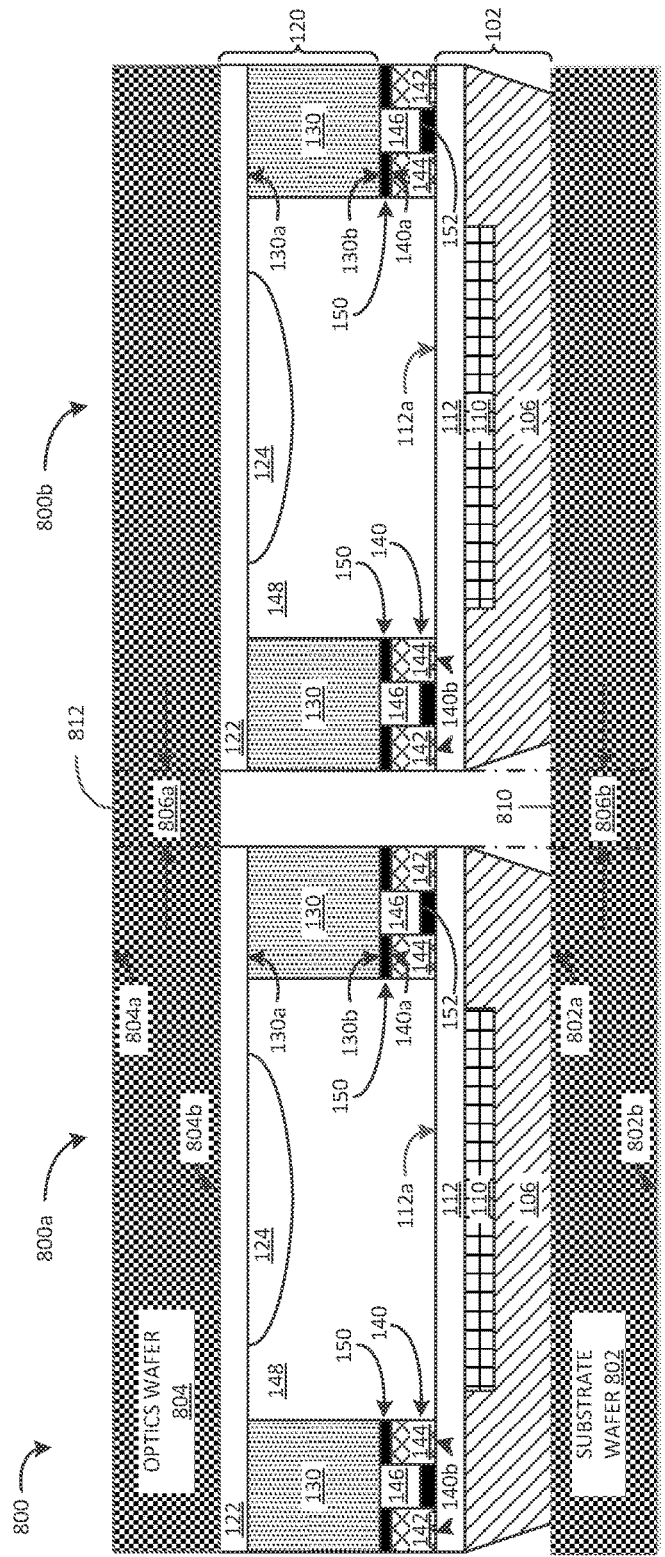
FIGS. 8A-8B are cross-sectional views of embodiments of wafer-level trenched-bonding-dam devices assembled according to an embodiment of the method of FIG. 2.
Figure 8B:
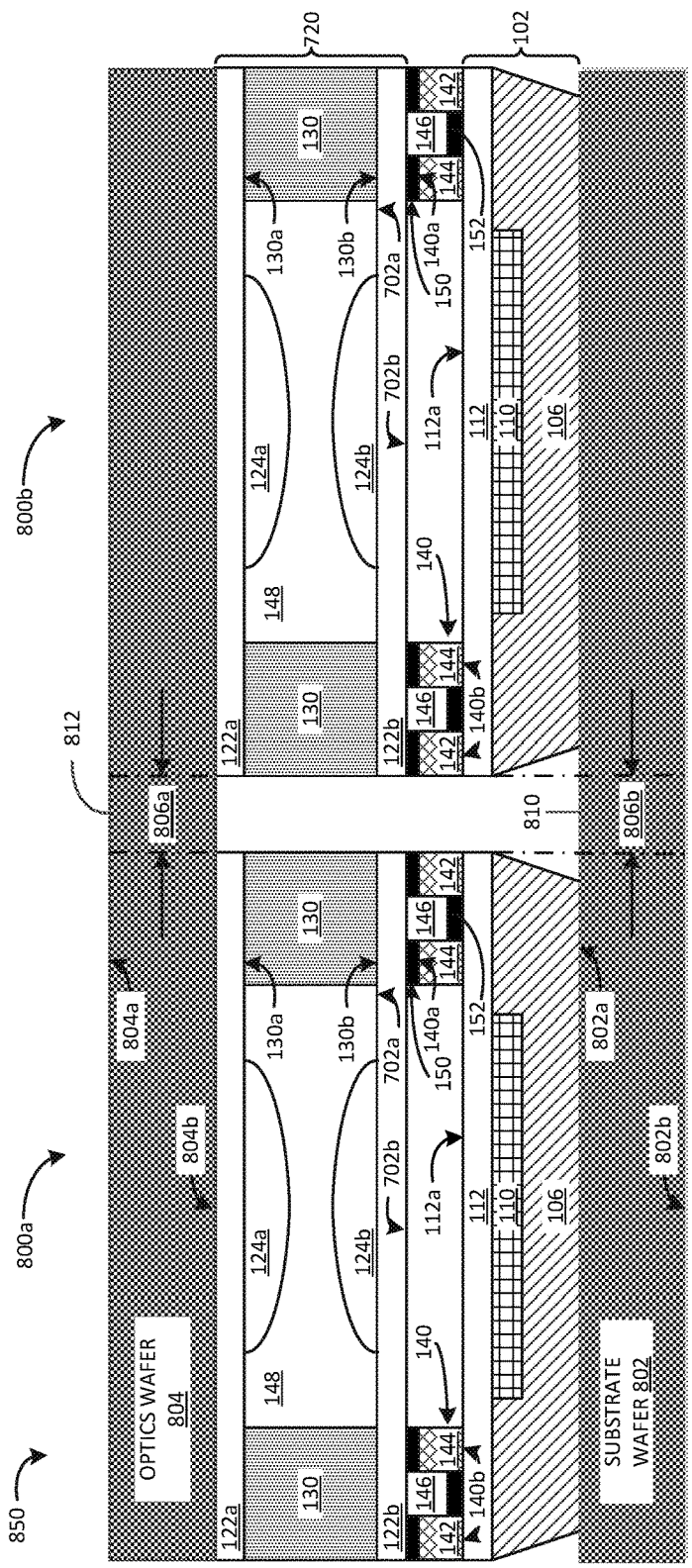

FIGS. 8A-8B present embodiments of wafer-level trenched-bonding-dam devices 800, 850, respectively. As illustrated in FIG. 8A, the wafer-level trenched-bonding-dam device 800 includes at least two trenched-bonding-dam devices (e.g., 800a, 800b). The trenched-bonding-dam devices 800a, 800b are each similar to trenched-bonding-dam device 100 except that the substrate 102 and optics system 120 of each device 800a, 800b is attached to wafers 802, 804 and laterally separated with scribe lines 806a, 806b therebetween.

The wafer-level trenched bonding dam device 800 may be formed according to embodiments of the method 200 discussed above. The alignment markers employed in operation 206, however, are different from those discussed above with respect to assembly of the trenched-bonding-dam device 100. A first alignment marker 810 is formed on at least one of a top surface 802a or bottom surface 802b of the substrate wafer 802 within the scribe line 806b. A second alignment marker 812 is formed on at least one of a top surface 804a or bottom surface 804b of the optics wafer 804 within the scribe line 806a. The alignment markers 810, 812 may be formed as discussed above with respect to alignment marker 402. Subsequently, in operation 206b, the first and second alignment markers 810, 812 are aligned such that the scribe lines 806a, 806b are vertically aligned. The aligned wafers 802, 804 are maintained in their aligned positions until the adhesive 150 is set. Subsequently, the wafers 802, 804 may be cut at the scribe lines 806a, 806b, respectively, to form individual die-level trenched-bonding-dam devices 800a, 800b (e.g., cameras modules) that may be integrated into other devices.

FIG. 8B is a cross-sectional view of an alternative embodiment of a wafer-level trenched-bonding-dam device 850. The wafer-level trenched-bonding-dam device 850 differs from the wafer-level trenched bonding dam device 800 as each of the respective devices 800a, 800b includes optics system 720 rather than optics system 120. As discussed above, the optics system 720 includes two lenses 124a and 124b coupled to respective lens plates 122a, 122b. The wafer-level trenched-bonding-dam device 850 is otherwise unchanged from wafer-level trenched-bonding-dam device 800 and may be formed according to the above-discussed embodiments of method 200.

Combinations of Features:

Features described above as well as those claimed below may be combined in various ways without departing from the scope hereof. The following examples illustrate some possible, non-limiting combinations:

(A1) A trenched-bonding-dam device includes a bonding dam structure positioned upon a top surface of a substrate. The bonding dam structure has (i) a bottom surface attached to the top surface of the substrate, (ii) an inner dam surrounded by an outer dam, and (iii) a trench between the inner and outer dams.

(A2) In a trenched-bonding-dam device denoted by (A1), the substrate may include at least one of an image sensor and a lens.

(A3) In a trenched-bonding-dam device denoted by one of (A1) and (A2), the bonding dam structure may be one of (a) a single piece structure having one of a U-shaped cross-section and a W-shaped cross-section, and (b) a two-piece structure, where the inner dam is a first piece and the outer dam is the a piece of the two-piece structure.

(A4) In any of the trenched-bonding-dam devices denoted by any one of (A1) through (A3), the device may include an optics system and an adhesive. The optics system includes a lens. The adhesive may be suitable for bonding the substrate to the optics system. The adhesive may be positioned within a bonding region between a bottom surface of the optics system and a top surface of at least one of (a) the inner dam and (b) the outer dam. The trench may be dimensioned to receive a portion of the adhesive flowing laterally out of the bonding region during bonding of the substrate to the optics system, thereby laterally confining the adhesive.

(A5) In a trenched-bonding-dam device denoted by (A4), the substrate may be a chip scale package (CSP) not attached to a wafer. The optics system may be a die-level optics system that is not attached to a wafer.

(A6) In the trenched-bonding-dam device denoted by one of (A4) and (A5), the substrate may be part of a first wafer having two laterally-separated substrate elements. The two laterally-separated substrate elements may include two chip scale packages (CSPs) with a substrate scribe line therebetween. Respective bonding dam structures are attached to a top surface of each CSP. The optics system may include a wafer-level optics system having at least two laterally-separated optics systems attached to a second wafer with an optics scribe line therebetween.

(A7) In any of the trenched-bonding-dam devices denoted by one of (A1) through (A6), the bonding dam structure may include at least one of photoresist, an epoxy, silicon, and a metal.

(A8) In any of the trenched-bonding-dam devices denoted by one of (A1) through (A7), at least one of the bonding dam structure and the substrate may include a first alignment marker. The optics system may include a second alignment marker. The optics system may be aligned with respect to the substrate such that the first alignment marker is approximately aligned with the second alignment marker.

(A9) In the trenched-bonding-dam device denoted by (A8), the bonding dam structure includes the first alignment marker.

(A10) In the trenched-bonding-dam device denoted by one of (A8) and (A9), the first alignment marker is the top surface of one of the inner and outer dams.

(A11) In the trenched-bonding-dam device denoted by (A6), the first wafer may include a first alignment marker positioned within the substrate scribe line. The second wafer may include a second alignment marker positioned within the optics scribe line.

(A12) In any of the trenched-bonding-dam devices denoted by one of (A1) through (A11), the bonding dam structure may include one side having only the outer dam.

(A13) A trenched-bonding-dam device includes a first substrate, a second substrate, a third substrate, a cover, a first bonding dam structure, a second bonding dam structure, and a third bonding dam structure. The first substrate may be coupled to a first lens. The second substrate may include a spacer and overlies the first substrate. The third substrate may be coupled to a second lens and overlies the second substrate. The cover may overlie the third substrate. The first bonding dam may include (i) a bottom surface attached to a top surface of the first substrate, (ii) a top surface attached to a bottom surface of the second substrate; (iii) a first inner dam surrounded by a first outer dam, and (iv) a first trench between the first inner dam and the first outer dam. The second bonding dam may include (i) a bottom surface attached to a top surface of the second substrate, (ii) a top surface attached to a bottom surface of the third substrate; (iii) a second inner dam surrounded by a second outer dam, and (iv) a second trench between the second inner dam and the second outer dam. The third bonding dam may include (i) a bottom surface attached to a top surface of the third substrate, (ii) a top surface attached to a bottom surface of the cover; (iii) a third inner dam surrounded by a third outer dam, and (iv) a third trench between the third inner dam and the third outer dam.

(B1) A method for fabricating a trenched-bonding-dam device includes attaching a bonding dam structure upon a top surface of a substrate, aligning an optics system with respect to a substrate element on the substrate, and bonding the aligned substrate and optics system to one another. The bonding dam structure has (i) a bottom surface attached to the top surface of the substrate, (ii) an inner dam surrounded by an outer dam, and (iii) a trench between the inner and outer dams. The optics system has a lens. The bottom surface of the optics system is coupled to a top surface of at least one of the inner and outer dams.

(B2) In the method denoted in (B1), the substrate may be a chip scale package (CSP) not attached to a wafer and the optics system may be a die-level optics system that is not attached to a wafer.

(B3) In the method denoted in (B1), the substrate may be part of a first wafer having two laterally-separated substrate element. The two laterally-separated substrate elements may include two chip scale packages (CSPs) with a substrate scribe line therebetween. Respective bonding dam structures may be attached to a top surface of each CSP. The optics system may include a wafer-level optics system having at least two laterally-separated optics systems attached to a second wafer with an optics scribe line therebetween.

(B4) In the method denoted in any of (B1) through (B3), the step of attaching the bonding dam structure upon the top surface of the substrate may include forming the bonding dam structure upon the top surface of the substrate.

(B5) In the method denoted in (B4), the step of forming the bonding dam structure may include at least one of lithography, glue replication, etching, and plating.

(B6) In the method denoted in any of (B1) through (B5), the bonding dam structure may include at least one of photoresist, an epoxy, silicon, and a metal.

(B7) In the method denoted in any of (B1) through (B6), the step of bonding may include depositing an adhesive by a roller print, stencil print, and line pattern process.

(B8) In the method denoted in (B2), at least one of the bonding dam structure and the substrate may include a first alignment marker and the optics system may include a second alignment marker. The step of aligning the optics system with respect to the substrate may include aligning the first alignment marker with respect to the second alignment marker.

(B9) In the method denoted in (B8), the first alignment marker being the top surface of one of the inner and outer dams.

(B10) In the method denoted in one of (B8) and (B9), the step of aligning the optics system with respect to the substrate may further include aligning an optical center of the optics system with a center of one of the first and second dams.

(B11) In the method denoted in (B3), the first wafer may include a first alignment marker positioned within the substrate scribe line and the second wafer may include a second alignment marker positioned within the optics scribe line. The step of aligning the optics system with respect to the substrate may include aligning the first alignment marker with respect to the second alignment marker.

(B12) In the method denoted in any of (B1) through (B11), the bonding dam structure may include one side having only the outer dam.

Changes may be made in the above systems and methods without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present method and systems, which, as a matter of language, may fall therebetween.

What is claimed is:

1. A trenched-bonding-dam device comprising:
   a substrate that includes a top substrate surface and an element that is one of an image sensor and a lens;
   a bonding dam structure having (i) a bottom dam surface attached to the top substrate surface, (ii) an inner dam surrounded by an outer dam, and (iii) a trench between the inner and outer dams;
   an adhesive layer on a top dam surface, opposite the bottom dam surface, of at least one of the inner dam and the outer dam;
   a spacer having a bottom spacer surface opposite a top spacer surface, the bottom spacer surface being bonded directly to the top dam surface via the adhesive layer and spanning the trench, the adhesive layer being between the spacer and the top dam surface; and
   a lens plate having a lens thereon and having a bottom plate surface bonded to the top spacer surface, the bottom plate surface and the top substrate surface defining a gap therebetween having a height determined in part by a thickness of the adhesive layer.

2. The trenched-bonding-dam device of claim 1, the bonding dam structure being one of (a) a single piece structure having one of a U-shaped cross-section and a W-shaped cross-section, and (b) a two piece structure, where the inner dam is a first piece and the outer dam is a second piece of the two-piece structure.

3. The trenched-bonding-dam device of claim 1, the substrate being a chip scale package not attached to a wafer, and further comprising a die-level optics system that (i) includes a lens and (b) is not attached to a wafer.

4. The trenched-bonding-dam device of claim 1,
   the substrate being part of a first wafer having two laterally-separated substrate elements, the two laterally-separated substrate elements including two chip-scale packages with a substrate scribe line therebetween, wherein respective bonding dam structures are attached to a top surface of each chip-scale package;
   the optics system including a wafer-level optics system having at least two laterally-separated optics systems attached to a second wafer with an optics scribe line therebetween.

5. The trenched-bonding-dam device of claim 4:
   the first wafer including a first alignment marker positioned within the substrate scribe line;
   the second wafer including a second alignment marker positioned within the optics scribe line.

6. The trenched-bonding-dam device of claim 1, at least one of the bonding dam structure and the substrate including a first alignment marker, and further comprising:
   an optics system including a lens and a second alignment marker, the optics system being aligned with respect to the substrate such that the first alignment marker is aligned with the second alignment marker.

7. The trenched-bonding-dam device of claim 6, the bonding dam structure including the first alignment marker.

8. The trenched-bonding-dam device of claim 6, the first alignment marker being the top surface of one of the inner and outer dams.

9. The trenched-bonding-dam device of claim 1, the bonding dam structure including one side having only the outer dam.

10. The trenched-bonding-dam device of claim 1, the entirety of the bonding dam structure being directly between the adhesive layer and the top substrate surface.

11. The trenched-bonding-dam device of claim 1, the adhesive layer being on both (i) a top surface, opposite the bottom dam surface, of the inner dam and (ii) the outer dam.

* * * * *